United States Patent [19]
Milnes

[11] 4,445,965
[45] May 1, 1984

[54] METHOD FOR MAKING THIN FILM CADMIUM TELLURIDE AND RELATED SEMICONDUCTORS FOR SOLAR CELLS

[75] Inventor: Arthur G. Milnes, Pittsburgh, Pa.

[73] Assignee: Carnegie-Mellon University, Pittsburgh, Pa.

[21] Appl. No.: 387,961

[22] Filed: Jun. 14, 1982

Related U.S. Application Data

[63] Continuation of Ser. No. 215,079, Dec. 1, 1980, abandoned.

[51] Int. Cl.³ .............................................. C30B 19/12
[52] U.S. Cl. ........................... 156/624; 156/DIG. 72; 156/DIG. 88; 136/258; 136/260; 136/262
[58] Field of Search ................... 136/258, 260, 262; 156/624, DIG. 72, DIG. 88, 610, 621; 427/87; 148/174, 175

[56] References Cited
U.S. PATENT DOCUMENTS

| | | | |
|---|---|---|---|
| 3,959,045 | 5/1976 | Antypas | 156/621 |
| 3,993,533 | 11/1976 | Milnes et al. | 156/624 |
| 4,116,751 | 9/1978 | Zaromb | 156/610 |
| 4,255,208 | 3/1981 | Deutscher et al. | 156/610 |

OTHER PUBLICATIONS

Horel et al., IBM Technical Disclosure Bulletin, vol. 18, No. 2, 7/75, pp. 544–545.
McClelland et al., 38th Annual Device Research Conference 6/23-25, 1980, Cleft Process.
Pamplin, Crystal Growth 2d, Pergamon, N.Y., 1980.

*Primary Examiner*—Hiram H. Bernstein
*Attorney, Agent, or Firm*—Buell, Blenko, Ziesenheim & Beck

[57] ABSTRACT

A thin cadmium-telluride semiconductor film for use in solar cells is grown epitaxially on a second semiconductor film, typically tellurium, which may be epitaxial on a substrate semiconductor, typically single-crystal cadmium-telluride. The second semiconductor has a lower resistance to layered cleaving than the desired semiconductor. Application of a strain to the sandwich causes the desired thin CdTe layer to peel off by fracture along the plane of the second semiconductor.

19 Claims, 4 Drawing Figures

WEDGE TO FRACTURE 11

METHOD FOR MAKING THIN FILM CADMIUM TELLURIDE AND RELATED SEMICONDUCTORS FOR SOLAR CELLS

This application is a continuation of my application Ser. No. 215,079 of Dec. 10, 1980, now abandoned.

My invention relates to a method for making thin semiconductor film for use in solar cells. More particularly, my method is concerned with a new method for fabricating single or near single-crystal films of CdTe or other related semiconductors in the range of 5 to 50 micrometers thickness for use in solar cells. Such films, produced at low cost, offer the possibility of providing np junctions or Schottky barrier metal-n semiconductor junctions for cheap photovoltaic solar cells for the direct generation of electrical energy from sunlight.

PRIOR ART AND THE PROBLEM PRESENTED TO THE INVENTOR

Present methods of fabricating solar cells of CdTe include the method of Cusano (Solid-State Electronics, Vol. 6, p. 217, 1963) in which a heterojunction cell is formed by the growth of p type $Cu_{2-x}Te$ on the surface of a CdTe layer (either n type or with a pn junction) grown on a glass substrate with a conducting electrode or on a metallic substrate.

The advantage of CdTe is that it has a direct energy band gap (1.5 eV) that matches the solar spectrum better than that of Si and that it is a II–VI compound semiconductor that can be doped both n and p type and is made of elements that are in plentiful supply and low in cost. Since it is a direct band gap semiconductor, solar light is absorbed close to the surface and therefore only a thin layer of CdTe is needed as an absorber. Such considerations have led to the study of pn CdTe cells and heterojunctions of CdS/CdTe, ITO/CdTe (ITO=indium tin oxide) and ZnO/CdTe. The solar efficiencies achieved to date are in the range of 6 to 12% as reported, for instance, by Courreges, Fahrenbruch and Bube in the paper "Sputtered Indium-Tin Oxide/Cadmium Telluride Junctions and Cadmium Telluride Surfaces" J. Applied Physics, Vol. 51, p. 2175, 1980.

The advantage of heterojunction cells is that the large band gap component of the cell (such as CdS or ITO to ZnO) provides a window action that allows the solar photons to penetrate into the underlying CdTe to create electrons and holes that are separated by the electric field of the junction without wasteful recombination at the heterojunction interface or in the junction region. However, the relatively low performance of thin film CdTe based cells is attributable to the material being polycrystalline of small grain size. The grain boundaries act as sources of carrier recombination and also reduce the performance by introducing resistance into the thin layer.

Since it is desirable to make solar cells at a cost of less than $1 per watt of generating power, it is out of the question to use thick single crystal substrates: instead very low cost substrates must be used in conjunction with thin films. This problem has been considered by me in previous work. In my U.S. Pat. No. 3,993,533 it is taught that the production of CdTe thin film can be accomplished by release from an intermediate layer of InSb by making use of the low melting point or the rapid preferential chemical etching characteristics of InSb, to detach the desired CdTe layer by the technique termed "peeled film technology". The disadvantages of these approaches are that the application of high temperature to detach the CdTe layer may cause the layer to be low in strength; and the detachment of the CdTe by differential chemical etching of InSb is a slow process.

In yet another approach, in my U.S. Pat. No. 4,159,354, it is taught that large crystal sized thin films of CdTe may be grown on a molten thin layer of InSb on low cost substrates using the concepts of rheotaxy. The disadvantages of this approach are the cost and the inconvenience of the InSb growth, and that special measures such as Vee-notched shutters, as described on page 235 of the book Heterojunctions and Metal-Semiconductor Junctions, by Milnes and Feucht, Academic Press, 1972, must sometimes be used to control the nucleation on the InSb so that very large crystal growth occurs.

THE INVENTOR'S SOLUTION TO THE PROBLEM

The present invention describes a new technique for the fabrication of peeled thin films of large crystal grain size, or substantially single crystal cadmium telluride or related semiconductors (such as $CdTe_xSe_{1-x}$, $Zn_yCd_{1-y}Te$ and other II–VI ternary quaternary or quintary semiconductors essentially of Cd, Zn, Te, Se, S characterized by the formula $Zn_aCd_{1-a}S_bSe_cTe_{1-b-c}$ where a, b and c are between 0 and 0.49) that are of semiconductor quality suitable for solar cells and which are readily manufactured at low cost. During the fabrication of the film the semiconductor junction may also be formed or it may be added later. The junction may be a homojunction or a heterojunction of CdS, ITO, or ZnO or other wide band gap semiconductor (Eg.>1.5 eV). The junction may alternatively take the form of a semitransparent thin metal film of a metal such as Al, Au, Ag, Pt, Pd, Ni, Cu, that is known to form a Schottky rectifying junction on cadmium telluride or related semiconductors.

The invention is of particular promise because it will solve a major problem, namely that of finding a production method for low-cost solar cells. There are several competing approaches at present but all have problems that may or may not be resolvable.

The cells involved could be large in area, for example, 10 cm long×5 cm wide and be 5-20 μm thick. Such a cell at an efficiency of 10-12% would produce about 0.5 watt (peak). It is conceptually possible to produce such a finished cell at a cost of less than $1 per watt in large scale production.

The method I provide for growing the thin CdTe semiconductor film of large crystal grain size, or substantially single crystal form, comprises the use of a single crystal or nearly single crystal substrate seed of CdTe which has been prepared to have a thin coating of Te, and on this thin Te layer is grown epitaxially the desired thin CdTe semiconductor film. The sandwich is then attached to rigid supporting super- and substrates, such as glass, by a suitable adhesive and strain is applied so that the thin Te layer fractures, and the desired thin-film CdTe layer is obtained attached to its supporting (glass) superstrate. The thick CdTe seed substrate may then be reused to act as a seed for the generation of more thin-film CdTe layers.

DESCRIPTION OF A PREFERRED EMBODIMENT OF THE INVENTION

While I have shown certain objects, purposes and advantages of this invention, other objects, purposes and advantages will become apparent as the following description of the present preferred embodiment proceeds.

Figure 1:
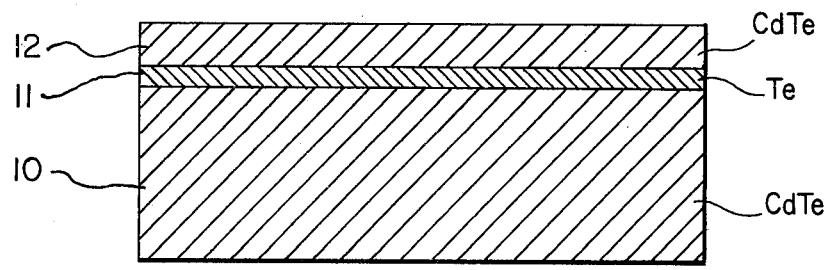
FIG. 1 is a cross-section of a first embodiment of the crystal sandwich of my invention.

FIG. 1 shows a slab 10 of a single crystal cadmium telluride, rectangular in shape and having dimensions of about 10 cm long by 5 cm wide by 0.5 cm thick. The top face of the slab 10 is treated so that a layer 11 of Te, or substantially Te, is grown on it to a thickness of between 500 and 5000 Å. This Te may be grown by one of several different known methods; namely (a) treatment of the surface of the CdTe slab 10 by an acid etch that has the effect of creating a Te layer by dissolution of Cd into the solution. Acid etches that do this include $$10 \text{ ml HNO}_3 : 20 \text{ ml H}_2\text{O} : 4 \text{ g K}_2\text{Cr}_2\text{O}_7 \qquad (1)$$

or $$2\text{HNO}_3 : 2\text{HCl} : 1\text{H}_2\text{O} \qquad (2)$$

or $$2\text{H}_2\text{O}_2 : 3\text{HF} : 1\text{H}_2\text{O} \qquad (3)$$

where the proportions are by volume and the active concentration of the solutions used were $HNO_3$ 70%, HCl 37%, $H_2O_2$ 30% and HF 45%.

For instance etch (1) applied for 10 minutes at room temperature creates a Te layer at least 500 Å thick and the surface is mirror smooth.

(b) Te may be vacuum evaporated or sublimed inert gas such as $N_2$ to deposit a Te layer of the desired thickness (c) Te may be electroplated from a Te rich solution. Appropriate Te plating technology is described on p. 472 of Lowenheim's "Modern Electroplating", 3rd edition, Wiley-Interscience.

(d) the CdTe may be dipped in a molten liquid of Te or Te alloy such as Te-Se, or (e) the Te may be sprayed on as a molten element in an inert atmosphere such as $N_2$, Ar or ($N_2 + H_2$ 10%).

The preferred methods and process conditions are those that result in an epitaxial layer of Te that is large in crystal gain size and has the $10\bar{1}0$ axis, the natural cleavage plane, parallel to the plane of the top surface of slab 10. The lattice constant c (parallel to the trigonal axis) of Te is 5.91 Å and this is a reasonable match to the cubic lattice parameter 6.48 Å of CdTe, so that large grain size epitaxial growth is possible.

The process then continues by the epitaxial growth of CdTe, layer 12 in FIG. 1, on the surface of the Te film. This may be done by one of several known processes including (f) close-spaced vapor transport epitaxy with a temperature gradient between a source ingot of CdTe and the seed slab consisting of elements 10 and 11. Typical close-spaced epitaxy systems are described in the book by A. G. Milnes and D. L. Feucht, "Heterojunctions and Metal Semiconductor Junctions," Academic Press, 1972, p. 239 and in the book by Sharma and Purohit, "Semiconductor Heterojunctions," Pergamon Press 1974, p. 45. Applications of such systems to the growth of CdTe have been made by Bube and coworkers and by Yamaguchi and coworkers (Japan J. Appl. Physics 15 p. 1575 and 16 p. 1203). The CdTe temperature should preferably be in the range that allows good epitaxy of CdTe. This is between 400° C. (450° C. is the melting point of Te) and 633° C., the temperature at which the vapor pressure of Te is still low, 10 mm Hg. Some advantages of rheotaxial epitaxy may be obtained (U.S. Pat. No. 4,159,354) if the Te overlayer 11 is molten during the close-spaced growth. The gas stream during the close-spaced epitaxial growth may be $H_2$, Ar, $N_2$ or a mixture of any of these with trace amounts of HCl or $O_2$ or other elements that may contribute to the transport or desired doping of the layer.

(g) Another growth method that is possible is the cathodic electrochemical plating of CdTe as described in the progress reports of Monosolar Inc. in work for the Department of Energy under contract EX 76-C-01-2457, Report No. 4 Apr. 1–June 30 1977 "Improved Semiconductors for Photovoltaic Solar Cells", ERA citation 03:030532 and available through NTIS.

(h) yet other methods of growth are the vacuum evaporation of CdTe and the Ar-ion sputtering of CdTe. Vacuum evaporation from a heated CdTe source is particularly effective because the evaporating species and phase diagram are such that stoichiometry of the deposited film is obtained readily. Also possible is the vapor deposition of Cd and Te from a gas stream containing Cd, $H_2$Te and HCl.

Figure 2:
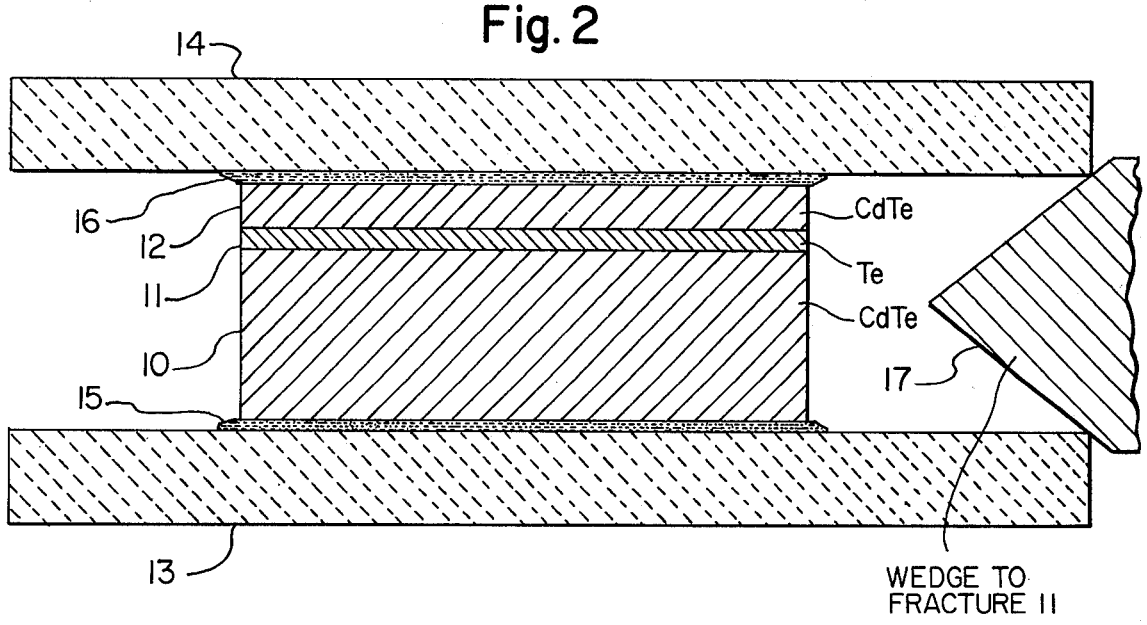
FIG. 2 is a cross-section of the sandwich of FIG. 1 attached to its rigid supports.

The structure of FIG. 1 having been obtained, the next process step is the provision of rigid supports 13 and 14, on either side of the semiconductor sandwich as shown in FIG. 2. The support 14 is preferably made of glass so that light may be passed through it into the CdTe film 12. The surface of the CdTe film 12 may be treated with a dopant to create a thin layer of opposite conductivity type (n or p) to form an np or pn homojunction. N type dopants in CdTe are In, Al, Cl, and p type dopants are P, Li, Na or Cu; As, Au are deeper acceptors as described on p. 162 of the book by K. Zanio, "Cadmium Telluride", Vol. 13, Semiconductors and Semimetals, Academic Press, 1978.

Instead of the creation of a homojunction a thin metal layer may be plated or evaporated or sputtered on the surface of CdTe layer 12 to promote a Schottky barrier metal-semiconductor junction. Alternatively a window heterojunction may be created by the deposition of a layer of nCdS or nITO or nZnO onto the surface of CdTe layer 12 if this is p type in conductivity. The heterojunction may be $pCu_{1-x}Te$ if the CdTe layer 12 is n type. The technology for creating such heterojunctions may be found referenced in the books by Milnes et al. and Sharma et al. previously cited.

Adhesion of the rigid support 14 is provided by an adhesive 16 that preferably should be transparent to much of the solar spectrum. Many epoxy adhesives are suitable for this purpose. The adhesive layer 15 used to attach the rigid support 13 is preferably one that is compatible with the subsequent reuse of slab 10 as a seed for the growth of subsequent layers of CdTe, so that 10 and 13 need not be again detached.

With supports 13 and 14 in place, strain is applied between them so that the sandwich fractures along the plane of weakness represented by the Te thin layer 11. It is a particular feature of the choice of Te that it is much weaker in fracture than the CdTe. FIG. 2 illustrates the use of a wedge 17 to achieve this fracture, but many other mechanical methods may be conceived to be equally effective. The sandwich may be raised in temperature to less than the melting point of Te (453° C.) to make the cleaving easier.

The rigid support 14 together with the adhering layer of CdTe 12 then forms the structure from which the solar cell may be completed.

DESCRIPTION OF ADDITIONAL EMBODIMENTS OF MY INVENTION

Te has a lattice constant c=5.91 Å which is a reasonable match to the lattice parameter a=6.48 Å of the zinc blende B3 type of CdTe. There are advantages in lattice matching in using metals like Pb and Sn as part of the intermediate layer 11. Layer 11 may be made of PbTe, for example. This compound has a crystal form of FCC NaCl (B1) type with a=6.45–6.50 Å which melts at 923° C. PbTe, therefore, offers a better crystal match to CdTe than does Te. This is an advantage in achieving a layer 11 on which can be grown a nearly-single-crystal layer of CdTe as layer 12. Although PbTe does not cleave quite as readily as Te, no difficulty is experienced in detaching the desired CdTe layer 12 by strain, as indicated in FIG. 2, because the dual interfaces between layers 10 and 11, and 11 and 12, lead to dislocations that weaken the adhesion.

Layer 11 may also be a mixture of PbTe and Te if the layer is Te-rich. The entectic involved has 85% Te and melts at 405° C.

The methods by which PbTe layer 11 may be coated on the CdTe seed include vacuum evaporation (preferably from a PbTe source) and close-spaced epitaxy from a PbTe source crystal in a hydrogen or nitrogen gas stream.

Since the melting point of PbTe is 923° C. the subsequent growth of a layer 12 of CdTe, for instance by vacuum evaporation or by close spaced epitaxy at temperatures between 400° C. and 650° C., is onto a solid film of PbTe.

References to the fabrication technology of PbTe are given in the books Jamieson et al., "Infrared Physics and Engineering", McGraw Hill (1963) p. 166 and Kruse et al., "Infrared Technology" Wiley (1962) p. 403, as well as in many more recent journal articles. Chemical etches for PbTe are given in Holmes, "The Electrochemistry of Semiconductors" Academic Press (1962), p. 367 et seq., as well as in more recent journal articles.

If Sn is included in the Te layer 11, SnTe forms and this also is an FCC crystal with a=6.32 Å which is a good match to the crystal lattice of CdTe and so promotes good crystal growth of the CdTe layer 12. Similarly the addition of In is advantageous since $In_2Te_3$ has a lattice constant a=6.146 Å that is also a reasonable match. Other added metals in layer 11 might be Ga (a=5.89 Å for $Ga_2Te_3$) or Ge (a=5.99 Å for GeTe).

Related semiconductors such as $CdSe_xTe_{1-x}$, $CdS_xTe_{1-x}$, $Zn_yCd_{1-y}Te$, $Zn_yCd_{1-y}S_xTe_{1-x}$ and $Zn_yCd_{1-y}S_zSe_xTe_{1-x-z}$ may be used for slab 10 and layer 12 where x, y and z may have values between 0 and 0.49. The materials CdSe, ZnTe, ZnSe, ZnS, CdS are semiconductors with lattice constants somewhat less than that of CdTe. Therefore the ternary quaternary and quintary compounds mentioned above also have lattice constants somewhat smaller than that of CdTe (a=6.48 Å). Hence by going to ternary quaternary or quintary compounds for slab 10 and layer 12 a closer lattice match may be achieved to that of layer 11 which may be Te, PbTe or SnTe, or Te-Se alloy.

It is not essential that the second semi-conductor layer 11 of Te be continuous. The tendency of some semiconductors such as Si to nucleate through holes in $SiO_2$ or a metal and overgrow the layer in good crystal form has been known for many years. It is the basis of devices with buried grids, such as permeable transistors or the early analog transistor of Shockley. Recently (1980) lateral growth of GaAs over a mask of carbonized photoresist has been demonstrated by McClelland, Bozler and Fan of Lincoln Laboratory MIT and used to provide thin GaAs films which are separated from their substrates by fracture along the carbonized photoresist layer. This process which they denominate "cleft" is similar in some respects to the process of U.S. Pat. No. 3,993,533 of which I am a co-inventor. In the "cleft" process the intermediate layer is an insulator or conductor which contributes little or nothing to the growth of the desired semi-conductor film because there is no attempt at lattice matching. I have found that layer 11 of Te may be interrupted so that the desired CdTe film grows in part on the CdTe substrate 10. The crystal match with the Te, though not as good as that with the CdTe, nevertheless facilitates the growth of large crystal grain size in the desired semi-conductor overlay, without increasing the difficulty of separating the desired film from the underlying layer.

Figure 4:
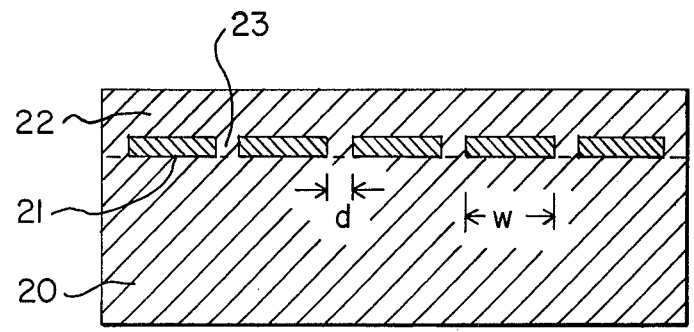
FIG. 4 is a cross section of the sandwich of FIG. 3.
Figure 3:
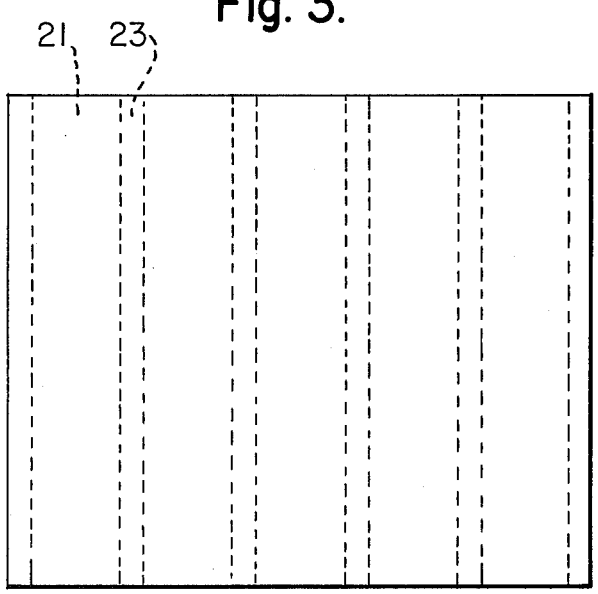
FIG. 3 is a plan of a crystal sandwich of a second embodiment of my invention.

FIGS. 3 and 4 illustrate diagramatically this embodiment of my process.

On the substrate 20, which as before is CdTe, Te is deposited in the form of thin spaced stripes 21 which extend parallel to each other across the substrate slab 20. Each stripe 21 has a width w as is shown in FIG. 4 and the stripes 21 are separated by uniform gaps d as is also shown. The width w may be 20 to 50 μm and the gap distance d may be 2 to 5 μm, for example. The Te film may be formed by any of the methods hereinbefore described. I prefer to deposit a continuous Te film and then form the gaps or reach-throughs by scribing through the Te film with a comb-like device or scratcher of appropriate dimensions since this process is quick and low in cost.

An alternative way of providing gaps or reach-throughs in the Te film is by evaporating or otherwise depositing Te in the presence of a thin metal masking grid or mesh over the CdTe surface 20 and then removing the mask and giving a light chemical etch for Te to clean up the holes. This is equivalent to imprinting or screening Te onto the surface. It is not essential that the Te be in the form of stripes; other interupted forms such as meshes are also perfectly satisfactory in providing gaps through which nucleation can occur at the CdTe substrate. It is also possible to pattern the Te by conventional photolithographic processing but this is presently uncommercial because of expense. To improve the adhesion and patterning of the Te other components such as $SiO_2$ or soft metals such as Pb, In, Sn or Se may be added to it.

Still another method of forming the Te stripes is by the use of a laser beam of a wave length which is absorbed by Te, a low band-gap substance, but not substantially absorbed by CdTe, a compound having band gap of 1.5 eV. The laser beam is passed through a mask, for example of metal strips on an optically transparent glass slide or of a metal mesh, and by thermal means brings about removal of the Te in its path by evaporation. The melting point of Te is 453° C. The specimen comprising substrate 20 plus the Te layer which results in the stripes 21 may be held at an elevated temperature less than 453° C. during the laser patterning. A reactive gas such as $H_2$ may be added to an inert gas stream in order to help carry away the Te removed.

The process described in the present invention is particularly applicable to CdTe film production since the use of Te as a layer of weakness is very compatible with the chemical and semiconductor properties of CdTe. For instance, the Te is a heavily p type semiconductor and any Te left on the underside of p CdTe layer 12 or layer 22 after peeling is a positive aid in making good ohmic contacts to the p CdTe film. Neither is Te a dopant in CdTe. Also any residual Te on the top surface of the CdTe seed slab can easily be leveled after the peeling process by raising the temperature of the seed to just above the melting point of the Te (453° C.). This reduces the need for re-surfacing of the CdTe seed. All these features make the use of Te, or the tellurium containing compounds described above, particularly appropriate for the intermediate second semiconductor layer (in continuous or interrupted form).

I claim:

1. A method of producing a desired first thin semiconductor film for use in solar cells comprising:
   (a) growing epitaxially a second semiconductor film on a third semiconductor the second semiconductor film having a lower fracture strength than the desired semiconductor film and the second semiconductor having a substantial lattice match with the desired semiconductor;
   (b) growing epitaxially the desired semiconductor film on the second semiconductor film so that the second semiconductor film orients the desired semiconductor film;
   (c) affixing a rigid substrate to the under surface of the third semiconductor and a rigid superstrate to the upper surface of the desired semiconductor film;
   (d) applying stress to the rigid superstrate and rigid substrate so as to fracture the said second semiconductor film; and
   (e) detaching the desired semiconductor film.

2. The method of claim 1 in which the desired semiconductor film and the third semiconductor have a substantial lattice match.

3. The method of claims 1 or 2 in which the desired semiconductor film is substantially a single crystal.

4. The method of claims 1 or 2 in which the third semiconductor is substantially a single crystal.

5. The method of claims 1 or 2 in which the desired semiconductor film and the third semiconductor are of the same composition.

6. The method of claims 1 or 2 in which the desired semiconductor film is a compound and the second semiconductor film comprises an element of that compound.

7. The method of claims 1 or 2 in which the second semiconductor film has a natural cleavage plane parallel to the desired semiconductor film.

8. The method of claims 1 or 2 in which the desired semiconductor film is a crystal of CdTe.

9. The method of claim 8 in which the second semiconductor film is a crystal of Te.

10. The method of claim 8 in which the third semiconductor is a crystal of CdTe.

11. The method of claims 1 or 2 in which the desired semiconductor film is a crystal selected from the group consisting of $CdTe_xSe_{1-x}$, $Zn_yCd_{1-y}Te$, $Zn_yCd_{1-y}Se_xTe_{1-x}$, $Zn_yCd_{1-y}Se_xS_{1-x}$, $CdS_xTe_{1-x}$, $Zn_yCd_{1-y}Sz_Se_xTe_{1-x-z}$ where x, y and z may have values between 0 and 0.49.

12. The method of claims 1 or 2 or 11 in which the second semiconductor film is selected from the group consisting of Te, PbTe, Te-rich mixtures of PbTe and Te, SnTe, $In_2$-Te, $Ga_2Te_3$ and GeTe.

13. The method of claim 12 in which the second semiconductor film after being epitaxially grown is mechanically treated to remove parallel thin stripes of the second semiconductor film so as to expose the third semiconductor therebelow but not to remove the stripes of the second semiconductor film remaining between the removed stripes.

14. The method of claim 13 in which the second semiconductor film is mechanically treated by scribing with a comb-like device.

15. The method of claim 12 in which the second semiconductor film after being epitaxially grown is selectively heated to remove parallel thin stripes of the second semiconductor film so as to expose the third semiconductor therebelow but not to remove the stripes of the second semiconductor film remaining between the removed stripes.

16. The method of claim 13 or 15 in which the stripes of the second semiconductor films removed are of width less than those of the stripes of the second semiconductor film remaining therebetween.

17. The method of claim 15 in which the second semiconductor film is selectively heated by covering it with a perforated mask or a partially optically transparent mask and impinging thereon a laser beam of a wave length which is absorbed by the second semiconductor film but is not substantially absorbed by the substrate semiconductor, whereby the portion of the second semiconductor film exposed by the perforations of the mask is evaporated but the portion of that film covered by the mask is not evaporated.

18. The method of claim 12 in which the second semiconductor film is selectively epitaxially grown on the third semiconductor so as to cover a first portion of the third semiconductor and leave uncovered a second portion of the third semiconductor.

19. The method of claim 18 in which the second semiconductor film is selectively epitaxially grown on the third semiconductor by covering it with a perforated mask and depositing the second semiconductor film material through the perforations of the mask on the third semiconductor.

* * * * *

UNITED STATES PATENT AND TRADEMARK OFFICE
CERTIFICATE OF CORRECTION

PATENT NO. : 4,445,965

DATED : May 1, 1984

INVENTOR(S) : ARTHUR G. MILNES

It is certified that error appears in the above-identified patent and that said Letters Patent is hereby corrected as shown below:

On the Title Page, under "Related U.S. Application Data", the filing date of the parent case should be --Dec. 10, 1980--.

Column 1, line 45, "to" should be --or--.

Column 3, line 54, "gain" should be --grain--.

Column 5, line 52, after "Semiconductors", the quotations should be end quotation marks.

Signed and Sealed this

Eleventh Day of September 1984

[SEAL]

Attest:

GERALD J. MOSSINGHOFF

Attesting Officer

Commissioner of Patents and Trademarks